US009171713B2

(12) United States Patent
Lee

(10) Patent No.: US 9,171,713 B2
(45) Date of Patent: Oct. 27, 2015

(54) DEVICE AND METHOD FOR CONTROLLING SUPPLY VOLTAGE/FREQUENCY OF PROCESS VARIATION

(71) Applicant: Jong Pil Lee, Suwon-Si (KR)

(72) Inventor: Jong Pil Lee, Suwon-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/071,232

(22) Filed: Nov. 4, 2013

(65) Prior Publication Data

US 2014/0058552 A1 Feb. 27, 2014

Related U.S. Application Data

(63) Continuation of application No. 13/242,681, filed on Sep. 23, 2011, now Pat. No. 8,578,186, which is a continuation of application No. 11/863,485, filed on Sep. 28, 2007, now Pat. No. 8,046,598.

(30) Foreign Application Priority Data

Jan. 22, 2007 (KR) ........................ 10-2007-0006638

(51) Int. Cl.
G06F 19/00 (2011.01)
H02J 1/10 (2006.01)
(Continued)

(52) U.S. Cl.
CPC .............. *H01L 21/02* (2013.01); *G06F 1/3203* (2013.01); *G06F 1/324* (2013.01); *G06F 1/3296* (2013.01); *Y02B 60/1217* (2013.01); *Y02B 60/1285* (2013.01)

(58) Field of Classification Search
CPC ....... H01L 21/02; G06F 1/324; G06F 1/3296; Y02B 60/1217; Y02B 60/1285
See application file for complete search history.

(56) References Cited

U.S. PATENT DOCUMENTS 6,411,156 B1 6/2002 Borkar et al.
6,917,237 B1 7/2005 Tschanz et al.
(Continued)

FOREIGN PATENT DOCUMENTS

JP 2005-222536 8/2005

OTHER PUBLICATIONS

Office Action issued in corresponding Korean Patent Application No. 10-2007-0006638 issued Jan. 17, 2008.
(Continued)

*Primary Examiner* — M Elamin
(74) *Attorney, Agent, or Firm* — F. Chau & Associates, LLC

(57) ABSTRACT

A device capable of controlling a supply voltage and a supply frequency using information of a manufacturing process variation includes a data storage device storing data indicating performance of the device, a decoder decoding the data stored in the data storage device and outputting decoded data, and a frequency control block outputting a frequency controlled clock signal in response to the decoded data output from the decoder. The device further includes a voltage control block outputting a level controlled supply voltage in response to the decoded data. The voltage control block outputs a body bias control voltage controlling a body bias voltage of at least one of a plurality of transistors embodied in the semiconductor device in response to the decoded data. The performance is operational speed of the device or leakage current of the semiconductor device.

23 Claims, 5 Drawing Sheets

(51) Int. Cl.
*H01L 21/02* (2006.01)
*G06F 1/32* (2006.01)

(56) References Cited

U.S. PATENT DOCUMENTS

| | | | |
|---|---|---|---|
| 7,120,804 | B2 | 10/2006 | Tschanz et al. |
| 7,219,245 | B1 | 5/2007 | Raghuvanshi |
| 7,299,370 | B2 | 11/2007 | George et al. |
| 7,376,849 | B2 | 5/2008 | Tschanz et al. |
| 7,683,682 | B1 | 3/2010 | Won et al. |
| 8,046,598 | B2 | 10/2011 | Lee |
| 2002/0079951 | A1 | 6/2002 | Borkar et al. |
| 2004/0111231 | A1 | 6/2004 | Ando |
| 2004/0123170 | A1 | 6/2004 | Tschanz et al. |
| 2006/0020838 | A1 | 1/2006 | Tschanz et al. |
| 2000/0106564 | | 5/2006 | Jain et al. |
| 2006/0091385 | A1 | 5/2006 | Mair et al. |
| 2006/0223863 | A1 | 10/2006 | Narendra et al. |
| 2006/0226889 | A1 | 10/2006 | Gupta et al. |
| 2008/0106327 | A1 | 5/2008 | Meijer et al. |

OTHER PUBLICATIONS

Masakatsu Nakai, et al., "Dynamic Voltage and Frequency Management for a Low-Power Embedded Microprocessor," IEEE Journal of Solid-State Circuits, vol. 40, No. 1, Jan. 2005, pp. 28-35.

DEVICE AND METHOD FOR CONTROLLING SUPPLY VOLTAGE/FREQUENCY OF PROCESS VARIATION

CROSS-REFERENCE TO RELATED APPLICATIONS

This application is a Continuation application of U.S. patent application Ser. No. 13/242,681 filed on Sep. 23, 2011, now U.S. Pat. No. 8,578,186, which is a Continuation application of U.S. patent application Ser. No. 11/863,485 filed on Sep. 28, 2007, now U.S. Pat. No. 8,046,598, which claims priority to and the benefit of Korean Patent Application No. 10-2007-0003368 filed on Jan. 22, 2007, the entire contents of each of which are incorporated by reference herein.

BACKGROUND OF THE INVENTION

1. Technical Field

Exemplary embodiments of the present invention relate generally to a supply voltage/frequency control scheme and, more particularly, to a device controlling supply voltage/frequency using information of production process variations of a semiconductor and methods thereof.

2. Discussion of Related Art

As the technology of communication has developed, mobile systems, such as a mobile phone, a personal digital assistant (PDA), a moving picture mobile phone, or a notebook computer have become more and more important. Once a battery is fully charged, possible continuous operation time, that is, displaying how long the battery can be used, is one of the most important performance standards in a mobile system. Also, reducing power consumption of the mobile system has become one of the most important factors in designing a Very-Large-Scale Integration (VLSI) system or System on Chip (SoC).

More specifically, as a VLSI system or Sac is designed for high performance and high integration, power consumption of the VLSI system or the SoC rapidly increases, but on the other hand battery capacity or possible successive operation time is not increased as much as the power consumption. Therefore, it is a trend that the technique of reducing power consumption of the VLSI system or SoC, rather than an improvement of a battery itself, is studied as a priority.

High power consumption in a VLSI system or SoC may lower the performance of the VLSI system or the SoC by generating a lot of heat in the VLSI system or the SoC. Power consumption of a general VLSI system or SoC is mostly dynamic power consumption of a complementary metal-oxide-semiconductor (CMOS) circuit, which is embodied in the VLSI system or the Sac, and presented as the power consumption, $Pd \propto C_L V_{DD}^2 fp$.

Here, $C_L$ is the load capacitance of the CMOS circuit, $V_{DD}$ is a supply voltage, and fp means a number of cycles or the operating frequency at which a predetermined program is performed. Since the power consumption Pd is proportional to the square of the supply voltage $V_{DD}$, it is very efficient to lower the supply voltage $V_{DD}$ for reducing the power consumption.

FIG. 1 is a graph that displays the relationship between supply voltages and maximum operable frequencies. Referring to FIG. 1, when the supply voltage supplied to the VLSI system or Soc becomes lower, the maximum operable frequency of the VLSI system or the SoC also decreases. In other words, if the supply voltage supplied to VLSI system or Soc becomes lower, the calculation speed of the VLSI system or the Soc falls. Accordingly, a dynamic voltage scaling (DVS) scheme (or method), which can reduce power consumption of the VLSI system or the Soc while avoiding a decline of calculation speed of the VLSI system or the SoC, is extensively applied to the VLSI system or the SoC.

Operational speed of the CMOS circuit embodied in the VLSI system or the SoC is influenced by the maximum operable frequency, temperature, leakage current, or production process variations, and so on.

FIG. 2 is a graph illustrating the relationship between supply voltages and maximum operable frequencies according to a process variation. Referring to FIG. 2, maximum operable frequency (or operational speed) of a processor, for example, a CPU, according to a production process variation has a bigger variation range than that of a processor, for example, a CPU, according to a temperature variation. Also, referring to FIG. 2, when a supply voltage is low, the variation range of maximum operable frequency of the processor depending on temperature is not large.

Accordingly, when deciding upon a supply voltage supplied to a VLSI system or SoC, a process variation occurring in a production process of producing the VLSI system or the SoC is much more important than temperature variation of the VLSI system or the SoC. Therefore, it is required to have a device or method, which can control a supply voltage/frequency, or clock frequency, reflecting the maximum process variation occurring in a process of producing the VLSI system or Soc.

SUMMARY OF THE INVENTION

Exemplary embodiments of the present invention provide a method of programming data or information of a process variation in a semiconductor device. Also, exemplary embodiments of the present invention provide a device controlling the supply voltage/frequency supplied to the semiconductor device using data relating to the process variation programmed in a semiconductor device, and a method thereof.

Additionally, exemplary embodiments of the present invention also provide a main board including the semiconductor device.

Exemplary embodiments of the present invention also provide a computer and a mobile system, which comprise a main board including the semiconductor device.

An exemplary embodiment of the present invention is directed to a semiconductor device, including a data storage device storing data indicating performance of the semiconductor device, a decoder decoding the data stored in the data storage device and outputting decoded data, and a frequency control block outputting a frequency controlled clock in response to the decoded data output from the decoder.

The semiconductor device further includes a voltage control block outputting a level-controlled supply voltage in response to the decoded data. The voltage control block may output a body bias control voltage controlling a body bias voltage of at least one of transistors embodied in the semiconductor in response to the decoded data. The performance of the semiconductor device includes the operational speed of the semiconductor device or the leakage current of the semiconductor device. The data, which is stored in the data storage device, includes information about a production process variation of the semiconductor device or information about the current of at least one of transistors embodied in the semiconductor device.

The data storage device includes at least one fuse storing the data. A main board or a mobile system includes the semiconductor device.

An exemplary embodiment of the present invention is directed to a computer, including a main board with a semiconductor device installed thereon. The main board includes a data storage device storing data relating to the performance of the semiconductor device, a decoder decoding the data stored in the data storage device and outputting decoded data, and a frequency control block outputting frequency-controlled clock in response to the decoded data output from the decoder.

The main board outputs a level-controlled supply voltage or body bias control voltage controlling the body bias voltage of at least one of the transistors embodied in the semiconductor device. The performance includes the operational speed of the semiconductor device or the leakage current of the semiconductor device.

Another exemplary embodiment of the present invention is directed to a voltage/frequency control method, including a processor receiving and decoding data relating to the performance of a semiconductor device output from data storage device and outputting decoded data, and a control block controlling the frequency of a clock signal supplied to the processor, a supply voltage level supplied to the processor, or a body bias control voltage level controlling the body bias voltage of at least one of a plurality of transistors embodied in the semiconductor in response to the decoded data output from the processor.

The data is determined according to whether each of a plurality of fuses embodied in the data storage device is cut or not. The data includes information about a production process variation of the semiconductor device or information about the current of at least one of a plurality of transistors embodied in the semiconductor device.

BRIEF DESCRIPTION OF THE DRAWINGS

Exemplary embodiments of the present invention will be understood in more detail from the following descriptions taken in conjunction with the accompanying drawings of which.

DETAILED DESCRIPTION OF EXEMPLARY EMBODIMENTS

Figure 1:
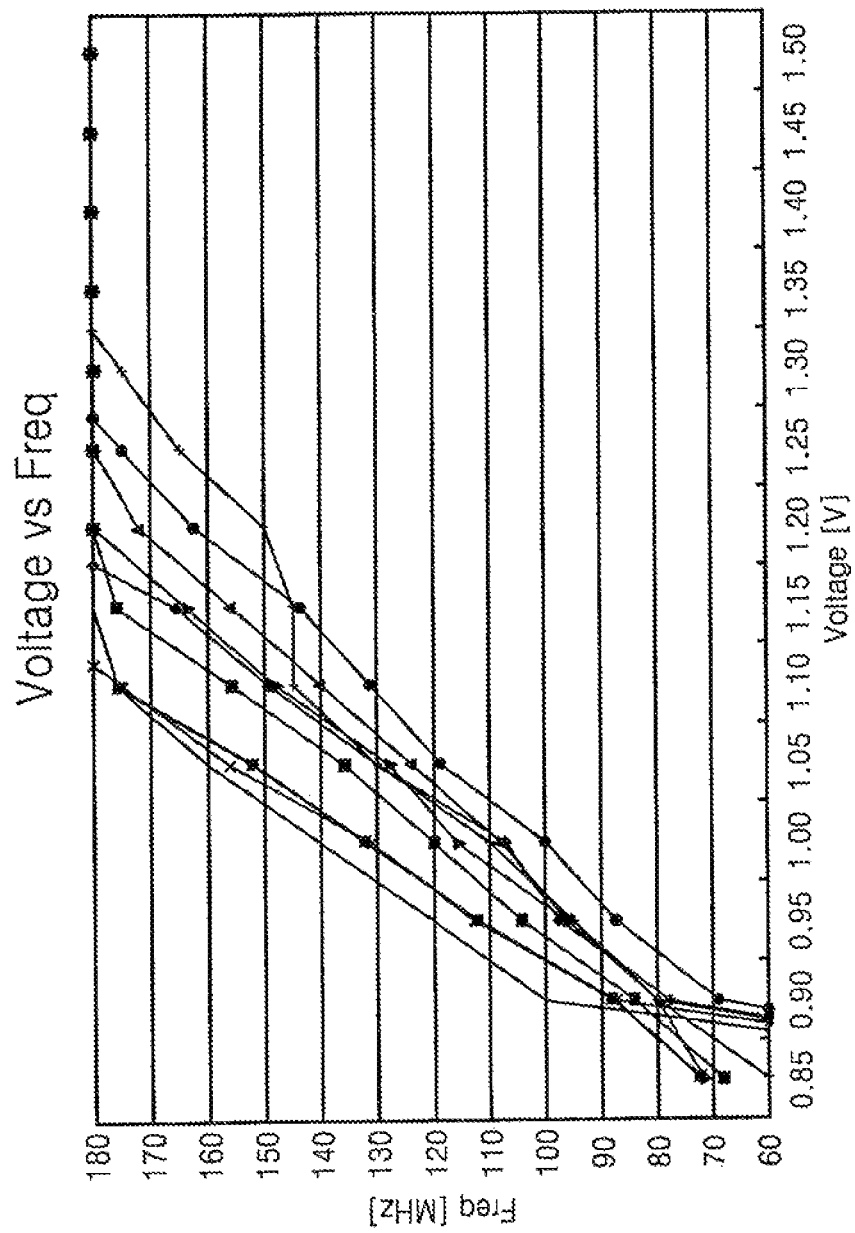
FIG. 1 is a graph showing a relationship between supply voltages and maximum operable frequencies.

Reference will now be made in detail to the exemplary embodiments of the present invention illustrated in the accompanying drawings, wherein like reference numerals refer to the like elements throughout. The exemplary embodiments are described below in order to explain the present invention by referring to the figures.

Figure 3:
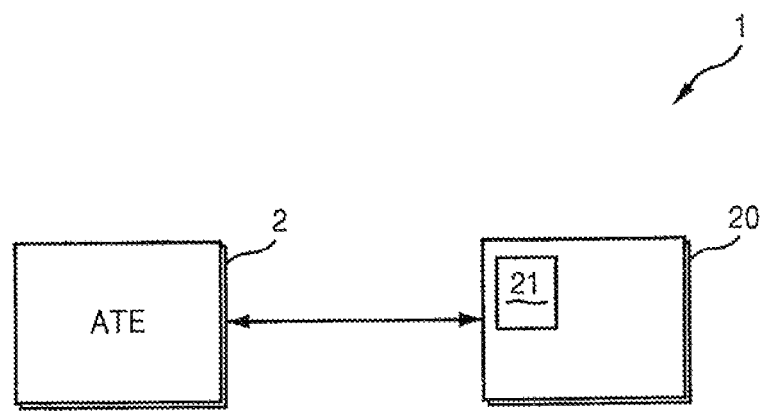
FIG. 3 is a block diagram of system including a semiconductor device according to an exemplary embodiment of the present invention and an automatic test equipment (ATE).

FIG. 3 is a block diagram of system including a semiconductor device according to an exemplary embodiment of the present invention and an automatic test equipment (ATE).

Referring to FIG. 3, an automatic test equipment (ATE) 2, which is capable of testing electronic devices (or electronic systems) such as printed circuit boards (PCBs), integrated circuits (ICs), electronics circuits, or modules of simple elements, for example, resistors, capacitors, inductors, transistors), tests a fabricated semiconductor device 20, for example, test through at-speed scan vector, test through at-speed function vector, or test through test element group, and so on.

The ATE 2 programs (or writes) data, for example, data on a process variation, maximum operable frequency, operational speed, or leakage current showing the performance, for example, operational speed of the semiconductor device 20, maximum operable frequency of the semiconductor device 20, or leakage current of the semiconductor device 20, which is obtained as a result of the test, in a data storage device 21.

The data storage device 21 may be embodied as a plurality of fuses, such as laser fuses or electrical fuses. More specifically, data showing the performance of the semiconductor device 20 may be stored in the plurality of fuses by cutting or not cutting each of the plurality of fuses. For example, the cutting may indicate one of data "1" and data "0" and not cutting may indicate the other of data "1" and data "0". Accordingly, the data storage device 21 may store n-bit data, where n is a natural number, using cut/uncut fuses.

The data storage device 21 may be embodied as at least one register. The at least one register may store n-bit data, where n is a natural number. The data storage device 21 may be embodied as hardware, software, or hardware storing software, that is, firmware.

When the semiconductor device 20 is produced by a fast process, the ATE 2 may program or store "000" in the data storage device 21. Also, when the semiconductor device 20 is produced by a normal process, the ATE 2 may program or store "001" in the data storage device 21. Additionally, when the semiconductor device 20 is produced by a slow process, the ATE 2 may program or store "111" in the data storage device 21.

In this exemplary embodiment, the fast process relates to a case that the current or amount of current, flowing in at least one of a plurality of transistors embodied in the semiconductor device 20 or at least one of the transistors selected to be a test target, is more than a predetermined standard current or standard amount of current. The normal process relates to a case that a current flowing in at least one of a plurality of transistors embodied in the semiconductor 20 or selected to be a test target, is as much as a predetermined standard current. The slow process relates to a case that a current flowing in at least one of a plurality of transistors embodied in the semiconductor 20 or selected to be a test target is less than a predetermined standard current.

Additionally, the fast process may be programmed in the data storage device 21 as at least more than one value, such as an n-bit value. Each different value, for example, n-bit, may be programmed in the data storage device 21 according to different data, for example, data on a process variation, a maximum operable frequency, data on operational speed, or data on a leakage current, relating to the performance of the semiconductor device 20, for example, operational speed of the semiconductor device, or leakage current, and so on.

For example, based on leakage current measured in ATE 20, each different value such as "001" for less than 1 mA, "010" for greater than 1 mA and less than 2 mA, or "011" for greater than or equal to 2 mA and 3 mA or less than may be programmed in the data storage device 21. Also, not only the fast process, but also normal or slow process may be programmed in the data storage device 21 as one or more n-bit value.

Figure 2:
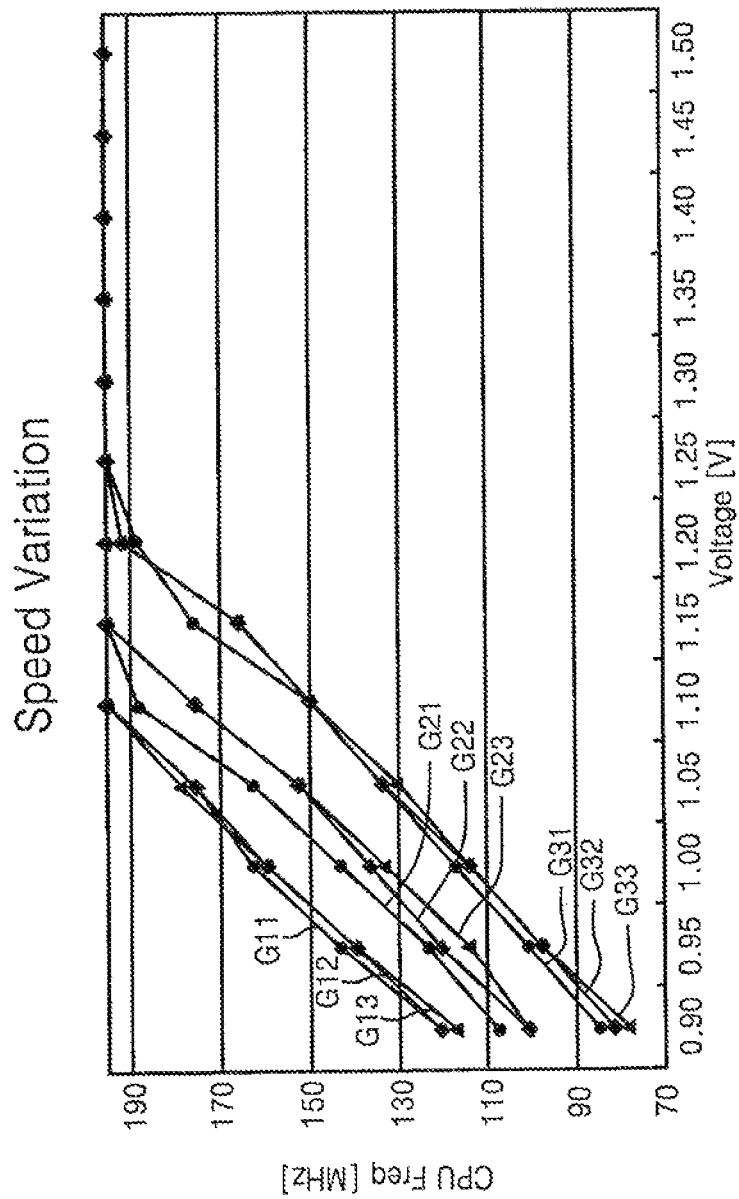
FIG. 2 is a graph showing a relationship between supply voltages and maximum operable frequencies according to a production process variation.
Figure 4:
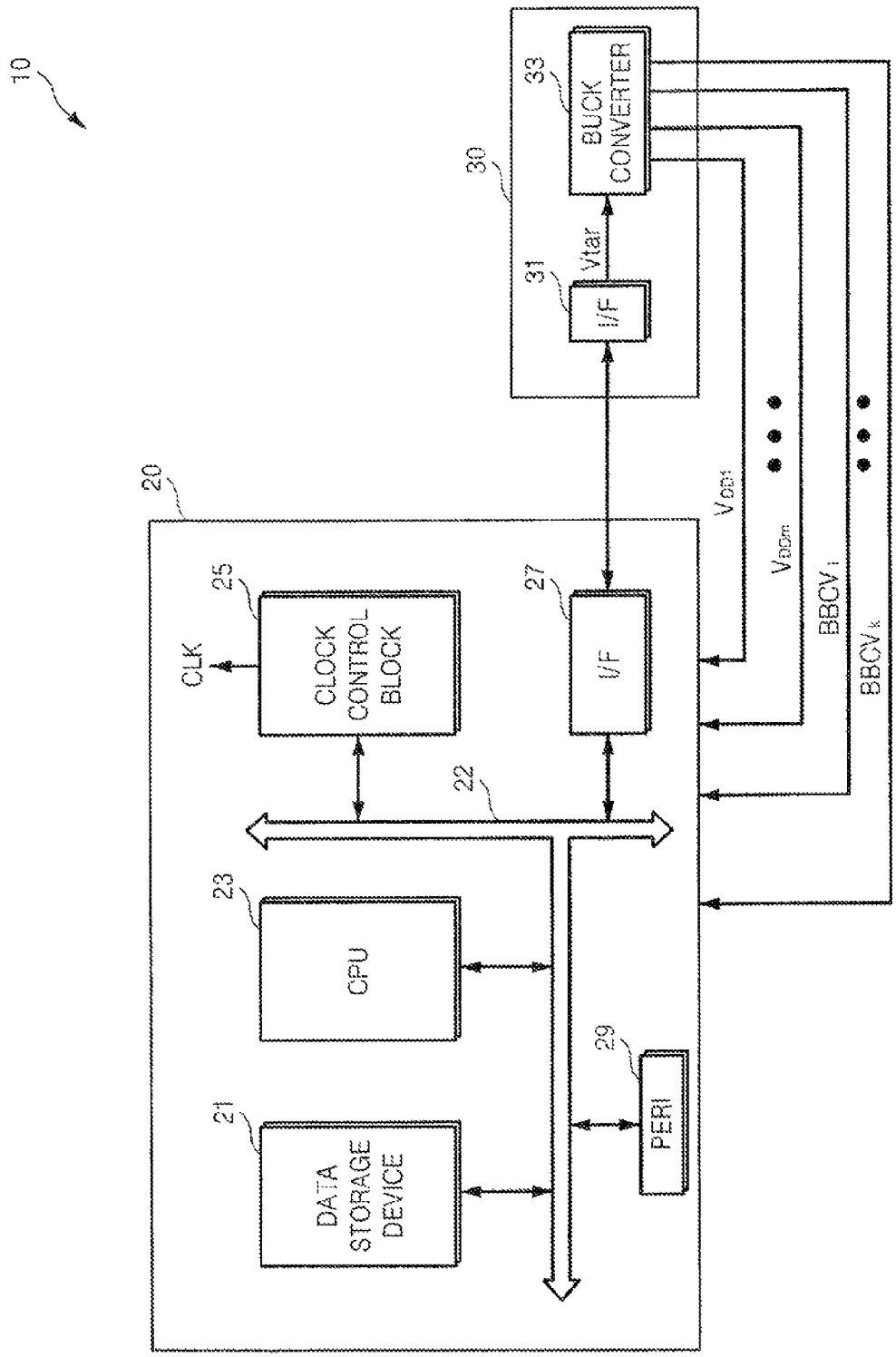
FIG. 4 is a block diagram of a semiconductor device according to an exemplary embodiment of the present invention.

Referring to FIGS. 2 through 4, the line G11 is a graph showing the relationship between a supply voltage, which is supplied to the processor, for example, CPU 23, of semiconductor device 20, and an operational speed or clock frequency of the processor, when the semiconductor device 20 produced by a fast process operates in a high temperature, such as 80° C. Also, the line G12 is a graph illustrating the relationship between the supply voltage, which is supplied to the processor, and an operational speed of the processor, when the semiconductor device 20 produced in a fast process operates in the normal ambient temperature, such as 25° C. In addition, the line G13 is a graph showing the relationship between the supply voltage supplied to the processor and the operational speed of the processor, when the semiconductor device 20 produced in a fast process operates in a low temperature, for example, −45° C.

The line G21 is a graph showing the relationship between a supply voltage, which is supplied to a processor, for example, CPU 23, and an operational speed of the processor when the semiconductor device 20 produced in a normal process operates in a high temperature, for example, 80° C., the line G22 is a graph showing the relationship between a supply voltage supplied to the processor and an operational speed of the processor when the semiconductor device 20 produced in a normal process operates in the normal ambient temperature, for example, 25° C., and the line G23 is a graph showing the relationship between the supply voltage supplied to the processor and an operational speed of the processor when the semiconductor device 20 produced in a normal process operates in a low temperature, for example, −45° C.

Additionally, the line G31 is a graph showing the relationship between a supply voltage supplied to a processor, for example, CPU 23 and an operational speed of the processor when the semiconductor device 20 produced in a slow process operates in a high temperature, for example, 80° C., the line G32 is a graph showing the relationship between the supply voltage supplied to the processor and the operational speed of the processor when the semiconductor device 20 produced in a slow process operates in the normal ambient temperature, for example, 25° C., and the line G23 is a graph showing the relationship between the supply voltage supplied to the processor and the operational speed of the processor when the semiconductor device 20 produced in a slow process operates in a low temperature, for example, −45° C.

Referring to FIG. 2, when a supply voltage supplied to a processor, for example, CPU 23, is held the same, the operational speed of the processor embodied in the semiconductor device 20 is fast in a fast process and slow in a slow process. When the supply voltage supplied to the processor is held the same, the operational speed of the processor embodied in the semiconductor device 20 is faster in a higher temperature and slower in a lower temperature. For example, when the operational speed of a processor is 130 MHz, the supply voltage supplied to the processor is about 1.05V in a fast process, 0.97V in a normal process, and 0.92V in a slow process.

FIG. 4 is a block diagram of a semiconductor device according to an exemplary embodiment of the present invention. Referring to FIG. 4, the system 10 includes the semiconductor device 20 and a voltage control block 30. The semiconductor device 20 and the voltage control block 30 may be made in a semiconductor device or a chip, or each of the semiconductor device 20 and the voltage control block 30 may be made in different semiconductor devices or chips.

The system 10 may be embodied as a main board 10, which is also called a mother board. When the system 10 is embodied as the main board, the system 10 may be used in a notebook computer, a desktop computer, or a hand held computer, and so on. Also, the system 10 may be used in a mobile system using a battery and having high heat emission, such as a mobile phone, a personal digital assistant PDA, or a Personal Multimedia Player (PMP).

The semiconductor device 20 includes a data storage device 21, a system bus 22, a processor CPU 23, a clock control block 25, an interface 27, and at least one peripheral device (PERI) 29. The of peripheral devices 29 may operate by being synchronized with the processor 23. The at least one peripheral device 29 may be an independent processor operating by using a supply voltage and clock frequency, which are different from the supply voltage and clock frequency supplied to the processor 23.

For example, the peripheral devices 29 can be an image processor processing image data, a graphic processor processing graphic data, or a universal asynchronous receiver/transmitter (DART), and so on. The system bus 22 may be embodied as a bus using the protocol of an APB interface or the protocol of an AHB interface.

Data, for example, n-bit data, 000, 001, or 111, which illustrates performance, such as clock frequency, maximum operable frequency, operational speed, or leakage current, and so on of the semiconductor device 20, is stored in the data storage device 21. The data may be programmed or stored by the ATE 2 shown in FIG. 1, or an additional test device (now shown) other than the ATE 2.

The processor 23, which is capable of performing a decoding function like a decoder, reads and decodes the data stored in the data storage device 21 through a system bus 22 after the power is applied to the system 10 or the semiconductor device 20, or during an operation, and outputs decoded data. The processor 23 may output the same decoded data or different decoded data to the clock control block 25 and the voltage control block 30.

The processor 23 may include a lookup table LUT (not shown). Accordingly, the processor 23 may decode data displaying performance, such as clock frequency, maximum operable frequency, operational speed, or leakage current of the semiconductor device 20 output from the data storage device 21 referring to the LUT. The LUT may be stored in a non-volatile memory (not shown) such as ROM, EPROM, or flash EEPROM. Also, the processor 23 may include predetermined software interpreting data that relates to the performance of the semiconductor device 20 output from the data storage device 21, or predetermined memory storing firmware.

The clock control block 25 may receive the decoded data output from the processor 23 through the system bus 22 and control or adjust the frequency of the clock signal CLK or operational frequency in response to received decoded data. The clock signal CLK may be supplied to at least one of the processor 23 or a peripheral device 29.

Accordingly, the clock control block 25 may output the optimum clock signal CLK frequency or operational frequency based on data relating to the performance, for example, operational speed or leakage current, of the semiconductor device 20 stored in the data storage device 21.

A voltage generator 33, which may be embodied as a buck converter, of the voltage control block 30 generates at least one level-controlled supply voltage ($V_{DD1}, \ldots, V_{DDm}$), where m is a natural number, based on data relating to the performance, for example, operational speed, of the semiconductor device 20 stored in the data storage device 21 in response to a voltage control signal Vtar input through an interface 31 of the voltage control block 30, which receives and sends predetermined signals from/to an interface 27 of the semiconductor device 20. The voltage control block 30 may be embodied as a voltage regulator.

More specifically, the voltage generator 33 controls at least one supply voltage level in response to data decoded by the processor 23, and outputs at least one of the level-controlled supply voltages ($V_{DD1}, \ldots, V_{DDm}$) to the semiconductor device 20. The processor 23 may operate in response to at least one of the level-controlled supply voltages ($V_{DD1}, \ldots, V_{DDm}$). The at least one of the level-controlled supply voltages ($V_{DD1}, \ldots, V_{DDm}$) may be supplied to at least one of the processor 23, the clock control block 25, or the peripheral circuit 29.

The voltage generator 33 of the voltage control block 30 may output a plurality of body bias control voltages BBCV1 to BBCVk, where k is a natural number, which control each body bias voltage of a plurality of transistors such as MOS FETs embodied in the semiconductor device 20, in response to a voltage control signal Vtar output through an interface 31. Each of the plurality of body bias voltages BBCV1 to BBCVk may control a body bias voltage of at least one of the transistors embodied in the semiconductor device 20.

Accordingly, the processor 23 of the semiconductor device 20 including a data storage device 21 according to exemplary embodiments of the present invention may judge somewhat exactly by which process the semiconductor device embodied in the processor 23 is produced from among fast process, normal process, and slow process. Therefore, exemplary embodiments of the present invention may ease specific character of leakage current or operational speed, which is used as a standard judging a good product from an inferior product in a semiconductor manufacturing process. A semiconductor device, which was judged as an inferior one in a conventional way, may be judged as a good product, so that the yield of semiconductor devices increases.

Figure 5:
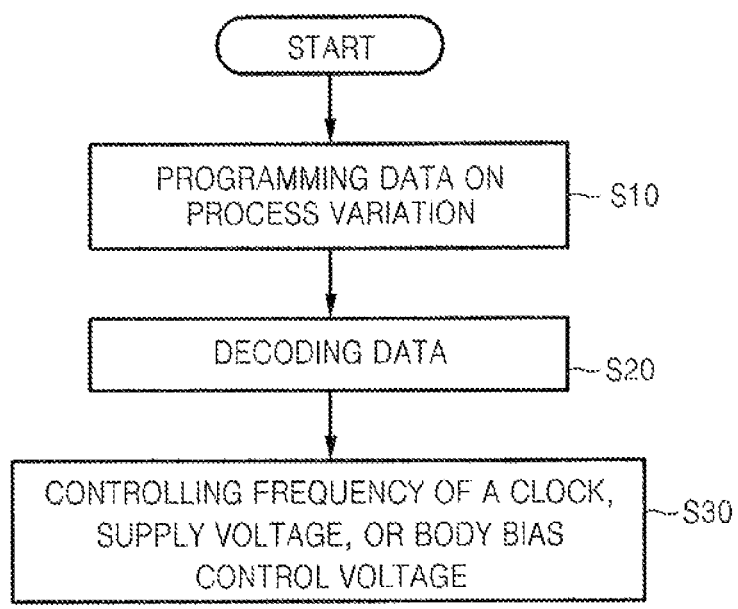
FIG. 5 is a flow chart to explain a method controlling supply voltage/frequency according to an exemplary embodiment of the present invention.

FIG. 5 is a flow chart used to explain a control method of supply voltage and supply frequency, according to an exemplary embodiment of the present invention.

Referring to FIGS. 2 to 5, a method for controlling a supply voltage and supply frequency, which are supplied to the semiconductor device 20, using information of a process variation of a semiconductor device can be explained as follows.

ATE 2, which is an example of test devices for testing a semiconductor device 20, determines a plurality of test items including operational speed of the semiconductor device 20 or leakage current, and programs (or stores) data showing performance of the semiconductor device 20 in a data storage device 21 as a result of determination (S10). The data can be data relating to information about by which process the semiconductor device 20 is produced among a fast process, a normal process, and a slow process, and can be data relating to information about leakage current of the semiconductor device 20.

The processor 23 receives and decodes data programmed or stored in the data storage device 21 through a system bus 22 and outputs decoded data (S20). A clock control block 25 controls the frequency of the clock signal CLK based on the decoded data output from the processor 23 and outputs a frequency-controlled clock signal CLK to at least one of the processor 23 or a peripheral device 29. FIG. 4 illustrates that a clock control block 25 outputs a clock. However, the clock control block 25 may output a plurality of clock signals to at least one of corresponding devices among a plurality of devices embodied in the semiconductor device 20 (S30).

The voltage control block 30 may control each level of a plurality of supply voltages based on the decoded data output from the processor 23 and output each level-controlled supply voltage ($V_{DD1}, \ldots, V_{DDm}$) to at least one of the processor 23 or the peripheral device 29 (S30).

Also, the voltage control block 30 may output each of a plurality of body bias control voltages BBCV1 to BBCVk to a body of each transistor that is embodied in the semiconductor device 20, based on the decoded data output from the processor 23 (S30).

A clock control block 25 and a voltage control block 30 according to exemplary embodiments of the present invention may adaptively control the frequency of a clock signal supplied to a semiconductor device 20, the level of a supply voltage, or the level of a body bias control voltage by using information of the process variation stored in a data storage device 21.

As described above, a semiconductor device according to exemplary embodiments of the present invention may store data of the process variation of the semiconductor device. Therefore, the semiconductor device may control exactly the level of a supply voltage supplied to the semiconductor device, the frequency of a clock signal, or the level of a body bias control voltage supplied to a body of a transistor embodied in the semiconductor device.

Also, when using a data semiconductor according to exemplary embodiments of the present invention, the yield of chips including the semiconductor device in a semiconductor manufacturing process is effectively increased.

Although exemplary embodiments of the present general inventive concept have been shown and described, it will be appreciated by those of ordinary skill in the art that changes may be made in these exemplary embodiments without departing from the principles and spirit of the present invention the scope of which is defined in the appended claims and their equivalents.

What is claimed is:

1. A semiconductor device comprising:
    a data storage device configured to store data related to performance of the semiconductor device;
    a processor configured to decode the data stored in the data storage device;
    a system bus;
    a clock controller configured to receive the decoded data via the system bus, and control a frequency of a clock signal based on the decoded data;
    one or more peripheral devices; and
    an interface,
    wherein the decoded data includes information on a performance variation including a supply voltage, a body bias voltage and a frequency, and
    the data stored in the data storage device is dynamically programmed after a normal fabrication process of the semiconductor device, the data including a temperature, information of a wafer fabrication process deviation from the normal fabrication process of the semiconductor device, and an operational voltage.

2. A semiconductor system comprising:
    a semiconductor device including:
        a data storage device configured to store data related to performance of the semiconductor device;
        a processor configured to decode the data stored in the data storage device;
        a system bus;
        a clock controller configured to receive the decoded data via the system bus, and control a frequency of a clock signal based on the decoded data;
        one or more peripheral devices; and
        a first interface; and a voltage controller including:
a voltage generator configured to control at least one supply voltage level in response to the decoded data; and
a second interface,
wherein the decoded data includes information on a performance variation including a supply voltage, a body bias voltage and a frequency, and the data stored in the data storage device is dynamically programmed after a normal fabrication process of the semiconductor device, the data including a temperature, information of a wafer fabrication process deviation from the normal fabrication process of the semiconductor device, and an operational voltage.

3. A semiconductor device comprising:
a data storage device configured to store data related to performance of the semiconductor device;
a processor configured to decode the data stored in the data storage device;
a system bus;
a clock controller configured to receive the decoded data via the system bus, and control a frequency of a clock signal based on the decoded data;
one or more peripheral devices; and
an interface,
wherein the data stored comprises information of a wafer fabrication process deviation from a normal fabrication process of the semiconductor device, and
wherein the data stored in the data storage device is dynamically programmed after the normal fabrication process of the semiconductor device.

4. A semiconductor system comprising:
a semiconductor device including:
a data storage device configured to store data related to performance of the semiconductor device;
a processor configured to decode the data stored in the data storage device;
a system bus;
a clock controller configured to receive the decoded data via the system bus, and control a frequency of a clock signal based on the decoded data;
one or more peripheral devices; and
a first interface; and
a voltage controller including:
a voltage generator configured to control at least one supply voltage level in response to the decoded data; and
a second interface,
wherein the data stored comprises information of a wafer fabrication process deviation from a normal fabrication process of the semiconductor device, and
wherein the data stored in the data storage device is dynamically programmed after the normal fabrication process of the semiconductor device.

5. The semiconductor system of claim 4, wherein the voltage controller is separate from the semiconductor device.

6. The semiconductor system of claim 4, wherein the voltage controller and the semiconductor device are integrated as one chip.

7. The semiconductor system of claim 4, wherein the voltage controller outputs a body bias control voltage and a level controlled supply voltage in response to the decoded data, the body bias control voltage controlling a body bias voltage of at least one of a plurality of transistors embodied in the semiconductor device.

8. The semiconductor system of claim 4, wherein the data stored in the data storage device includes temperature of the semiconductor device.

9. The semiconductor system of claim 8, wherein the temperature indicates a relationship between a supply voltage supplied to the processor and an operational speed of the processor over a temperature range.

10. The semiconductor system of claim 9, wherein the temperature range extends from a low temperature of about −45° C. to a high temperature of about 80° C.

11. The semiconductor system of claim 4, wherein the data stored in the data storage device includes a maximum operable frequency.

12. The semiconductor system of claim 4, wherein the data stored in the data storage device includes leakage current.

13. The semiconductor system of claim 4, wherein the data stored in the data storage device includes production process variations.

14. The semiconductor system of claim 4, wherein in the data storage device is embodied as a plurality of fuses.

15. The semiconductor system of claim 4, wherein the semiconductor system is embodied as a main board.

16. The semiconductor system of claim 4, wherein the semiconductor system is used in a computer including a notebook computer or a desktop computer, or used in a mobile device including a mobile phone, a personal digital assistant or a smartphone.

17. The semiconductor system of claim 4 wherein the processor outputs the same decoded data to the clock controller and to the voltage controller.

18. The semiconductor system of claim 4, wherein the processor outputs to the clock controller the decoded data different from the decoded data to the voltage controller.

19. The semiconductor system of claim 4, wherein the processor includes a lookup table stored in a non-volatile memory so that the processor refers the lookup table for decoding the data.

20. The semiconductor system of claim 4, wherein the voltage generator is embodied as a buck converter.

21. The semiconductor system of claim 4, wherein the processor measures a temperature, a process variation, and an operational voltage.

22. The semiconductor system of claim 4, wherein the processor monitors a temperature, a process variation, and an operational voltage.

23. A method of controlling a performance variation of a semiconductor device, comprising:
programming dynamically by software running on a processor data including a temperature, information of a wafer fabrication process deviation from a normal fabrication process of the semiconductor device, and an operational voltage of the semiconductor device;
storing the programmed data in a data storage device coupled to the processor;
decoding by the processor the data stored in the data storage device;
controlling by a clock controller a frequency of a clock signal based on the decoded data;
controlling by a voltage controller at least one supply voltage level in response to the decoded data; and
outputting the frequency of the clock signal and the at least one supply voltage level.

* * * * *